United States Patent [19]
Shyu

[11] Patent Number: 5,875,131
[45] Date of Patent: Feb. 23, 1999

[54] PRESETTABLE STATIC RAM WITH READ/WRITE CONTROLLER

[75] Inventor: Rong-Fuh Shyu, Hsinchu, Taiwan

[73] Assignee: Winbond Electronics Corp., Taiwan

[21] Appl. No.: 988,100

[22] Filed: Dec. 10, 1997

[51] Int. Cl.$^6$ .................................................. G11C 16/04
[52] U.S. Cl. .............................. 365/189.01; 365/189.04; 365/203; 365/230.06
[58] Field of Search ..................... 365/189.01, 189.04, 365/203, 204, 230.05, 230.06

[56] References Cited

U.S. PATENT DOCUMENTS

| | | | |
|---|---|---|---|
| 5,212,663 | 5/1993 | Leong | 365/189.01 |
| 5,793,663 | 8/1998 | Ng et al. | 365/189.05 |

Primary Examiner—David Nelms
Assistant Examiner—David Lam
Attorney, Agent, or Firm—Proskauer Rose LLP

[57] ABSTRACT

An array of static random access memory (SRAM) cells is configured for presetting to a particular value without the need to write to each cell in the array. Address line controllers are provided which are responsive to preset, read, and write signals. If a write control signal is asserted, the address line controllers maintain an asserted state on their address lines, so that a subsequent read cycle will output the written memory cell contents. However, if the memory cells in the array have not been written to, the address line controllers deassert their address lines, and simultaneously enable preset setting cells, so that a subsequent read cycle will output the logic state of the setting cells, rather than the contents of the array memory cells.

24 Claims, 11 Drawing Sheets

PRESETTABLE STATIC RAM WITH READ/WRITE CONTROLLER

FIELD OF THE INVENTION

The present invention relates to semiconductor random access memory (RAM). More specifically, the present invention relates to a static RAM (SRAM) architecture which can be preset to a particular value without requiring an initial write signal to each cell of the SRAM.

BACKGROUND OF THE INVENTION

Static RAM (SRAM) arrays are commonly used in digital data processing applications, e.g., as FIFO's in video displays and digital communication devices. This type of application frequently requires the SRAM array to be preset to a particular value. That is, each cell in the SRAM would be set to a logic 0 or a logic 1 by a write command. If the cells are preset sequentially by a series of write commands, the process can be very time consuming, especially for high density SRAM arrays. On the other hand, if all the cells in a high density SRAM are simultaneously preset, the resultant current surge can generate a significant amount of noise on the power supply rail. This power noise may cause significant malfunctions in both digital and analog circuit components, as well as causing inadvertent data alterations in various memory components of the system. Since industry trends require continuing increases in the number of memory bits per chip, thus increasing the density requirements of SRAM arrays, it is incumbent upon the chip designer to develop presetting techniques for high density SRAM arrays which are not excessively time consuming, and which do not cause the undesirable current surge problem noted above.

FIG. 1 shows a typical prior art SRAM structure, configured with p words and q bits. Each p word represents an access unit. In this example, q parallel bits are simultaneously accessed in response to a read or a write operation. The SRAM comprises an address decoder 1, an array 2, and an IO gateway 3. The array 2 has p by q entries. A single bit, e.g., BIT0 20, comprises p cells of different addresses and companion devices on internal data lines for facilitating data access. Address decoder 1, in response to an address bus, decodes address lines for the p words. IO gateway 3 has q cells, each associated with a single bit, and provides a data path for writing data from a data bus to array 2, and also for reading data from array 2 to the data bus.

FIG. 2 shows address decoder 1 and single bit 20 of FIG. 1 in greater detail. The array cells of single bit 20 are organized in mn rows and n columns, where m×n=p. Address decoder 1 is divided into a row address decoder 11 and a column address decoder 12. Row address decoder 11 decodes m row address lines X0, X1, ..., Xm−1 for the m rows. Column address decoder 12 decodes n column address lines Y0, Y1, ..., Yn−1 for the n columns. Array cells of a same row share, and are cascaded by, a row address line, e.g., X0. Array cells of a same column are shunted along a pair of data lines, e.g., C0 and CN0. The data lines of the n columns are combined into a pair of bit lines, B and BN, by n switches, each switch corresponding to one of the n columns. Each column address line outputted from column address decoder 12 (Y0, Y1, etc.) controls the turning on/off of the corresponding switch. Each pair of data lines (C0, CN0, etc.) is charged by a precharge cell, e.g., 201, which equalizes both data lines to a certain voltage level when no access event occurs. There is also a precharge cell 202, which performs the same voltage equalizing function on the pair of bit lines B and BN. An IO circuit 203, in response to a write control signal, passes data on the data bus to bit lines B, BN. In response to a read control signal, IO circuit 203 senses the voltage difference between the bit lines B, BN, and outputs a definite logic state to the data bus.

Each array cell is typically a six-transistor or a four-transistor memory cell within a CMOS circuit. Each switch is typically an NMOS pass transistor. The pairs of data lines Cj, CNj (j lies between 0 and n−1) and pairs of bit lines, B, BN are complementary. IO circuit 203 typically contains an input buffer and a sense amplifier operating exclusively in respective write and read access cycles.

In the special case where n=1, the array cells are constructed as p rows by one column, and the switches, the column address decoder 12, and the precharge cell 202 can be omitted. The row address lines Xi (i lies between 0 and m−1) represent exactly the word lines of the array cells, and the data lines Cj, CNj represent exactly the bit lines B, BN of the array cells.

As stated above, presetting each array cell sequentially can be very time consuming, whereas simultaneous presetting, or simultaneous resetting/clearing, may generate current surge noise problems.

One prior art technique to overcome the current surge problem when simultaneously resetting/clearing multibyte data is described in U.S. Pat. No. 5,212,663, by Leong. In this invention, an array of flag bits is added to the memory cell array of a SRAM, such that each word line of the memory cell array is associated with a corresponding flag bit. The flag bits are set to a "1" logic state for those word lines whose data was not previously altered. A reset control circuit is used to create a logical relationship between the flag bits and the sensed data bits, so that the resettable SRAM chip presents a "0" output logic state for all bits of the selected data when the selected data flag bit is set to a "1" logic state, irrespective of the actual content of the data in the memory cells. Thus, the need to reset all the memory cells in the array is eliminated through the use of flag bits.

This prior art technique, however, does not allow for the presetting of a SRAM array to a particular value without initially writing to each cell. Accordingly, it is an object of the present invention to overcome this limitation of the prior art; i.e., to preset a SRAM array to a particular value without initially writing to each cell. It is a further object of the present invention to avoid the problems of excessive time consumption (sequential preset) and noise generation from current surges (simultaneous preset), as described above.

SUMMARY OF THE INVENTION

In accordance with an illustrative preferred embodiment of the present invention, a conventional SRAM array is enhanced through the addition of row controllers, an enabling circuit, and setting cells, to control the presetting and accessing of the bits in the array.

A single bit of the SRAM is arranged as an array of memory cells, in m rows and n columns, with each column having an associated set of data lines. A quantity m row controller circuits are connected between a row address decoder and the m rows of memory cells, so that the m row controllers can control the access state of their corresponding m rows of memory cells. A column address decoder outputs column control signals to the row controllers, and also to a quantity n switches. The n switches are individually connected to the n sets of data lines (one switch for each data line column), in order to switch the outputs of their n corresponding sets of data lines to a common set of bit lines.

An enabling circuit receives an output signal from the row controllers which identifies the occurrence (or lack thereof) of a write signal. The function of the enabling circuit is to output an enabling signal in the absence of a write signal, indicating that the SRAM array memory cells have not been altered. The enabling circuit output signal is inputted to a quantity n setting cell circuits, which are individually connected to their corresponding set of n column data lines. At a subsequent read cycle, the setting cells will output a particular (preset) logic state value to their corresponding data lines. Depending on the wiring configuration, the setting cells can output either a logic 0 or a logic 1.

An input output (10) circuit is connected between the common set of bit lines and a data bus, for passing data from the data bus to the bit lines upon receipt of a write signal, and for passing data from the bit lines to the data bus upon receipt of a read signal.

When any of the row controller circuits senses a write signal on its corresponding row line of memory cells, the row controller circuit maintains the asserted state of its corresponding row line, so that a subsequent read cycle will cause the contents of the corresponding row of memory cells to be outputted on the associated data lines. Conversely, when the row controller circuits do not sense a write signal on any of their corresponding row lines of memory cells, the row controller circuits force the deassertion of their corresponding row lines, and simultaneously cause the enabling circuit to output an enabling signal to the setting cells. When a subsequent read cycle occurs, the setting cells provide their particular logic state output to the data lines, irrespective of the content of the SRAM array memory cells.

Another embodiment of the present invention uses column controllers instead of row controllers in a similar type of SRAM configuration. This embodiment only requires a single setting cell for each bit of the array.

Another embodiment of the present invention applies to a configuration of one column per single bit. In this embodiment, p row controllers, one enabling circuit, and one setting cell are required.

A different embodiment of the single column per bit configuration uses a column controller instead of the p row controllers, in addition to an enabling circuit and a setting cell. This configuration also requires a column control switch.

These illustrative embodiments of the present invention are more fully described below in conjunction with the following drawings.

DETAILED DESCRIPTION OF THE INVENTION

Figure 1:
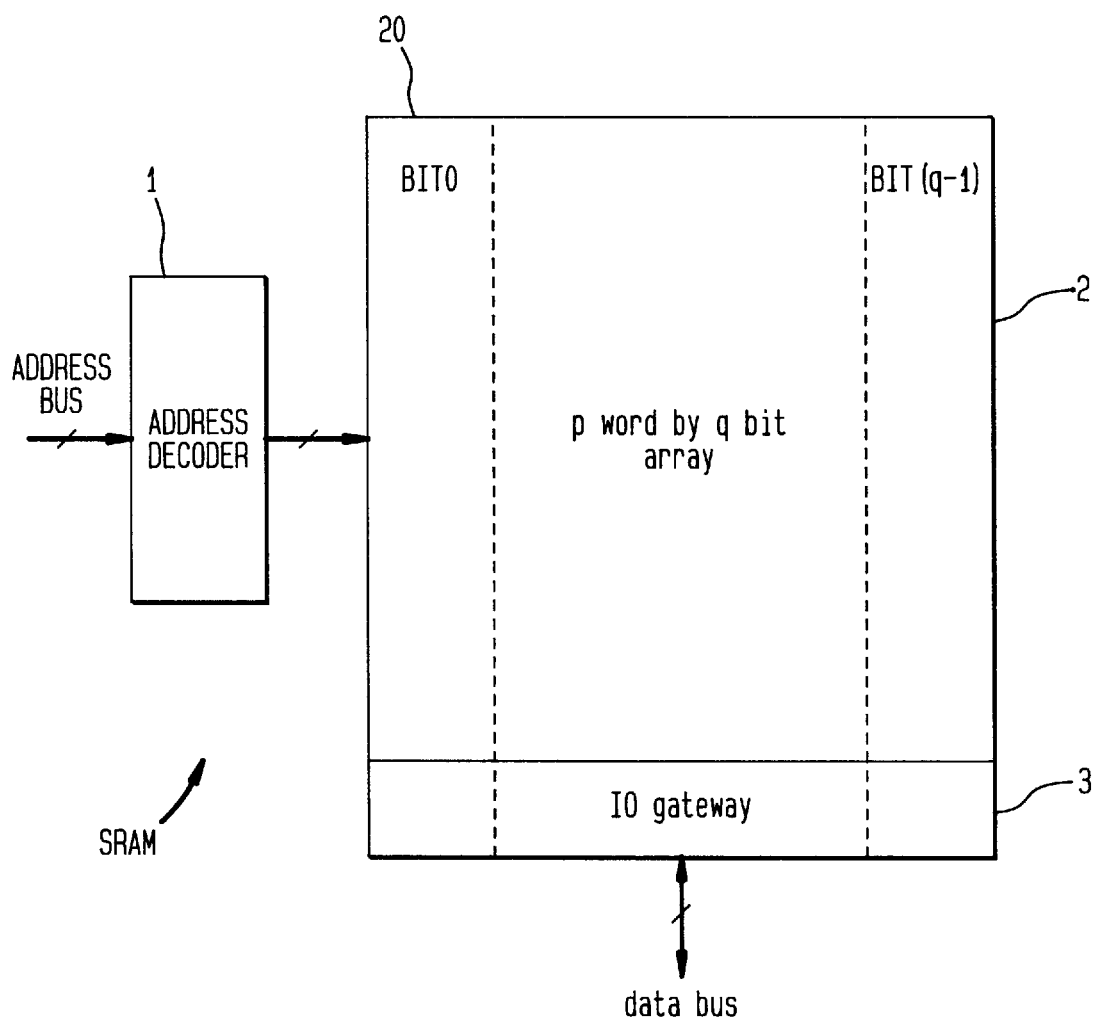
FIG. 1 shows a block diagram of a typical SRAM array (prior art).
Figure 2:
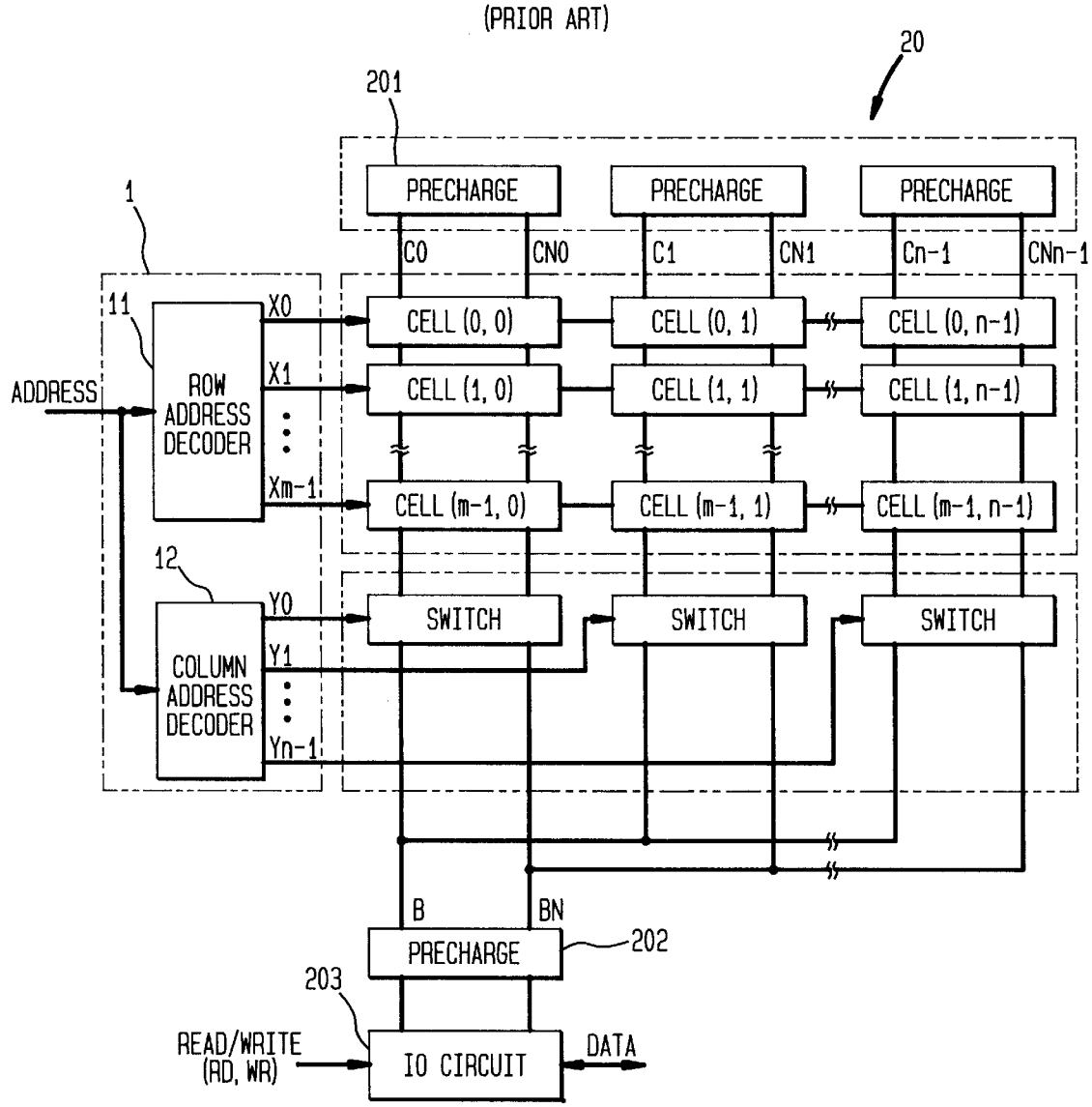
FIG. 2 shows the detail of a single bit of the SRAM array shown in FIG. 1 (prior art).
Figure 3:
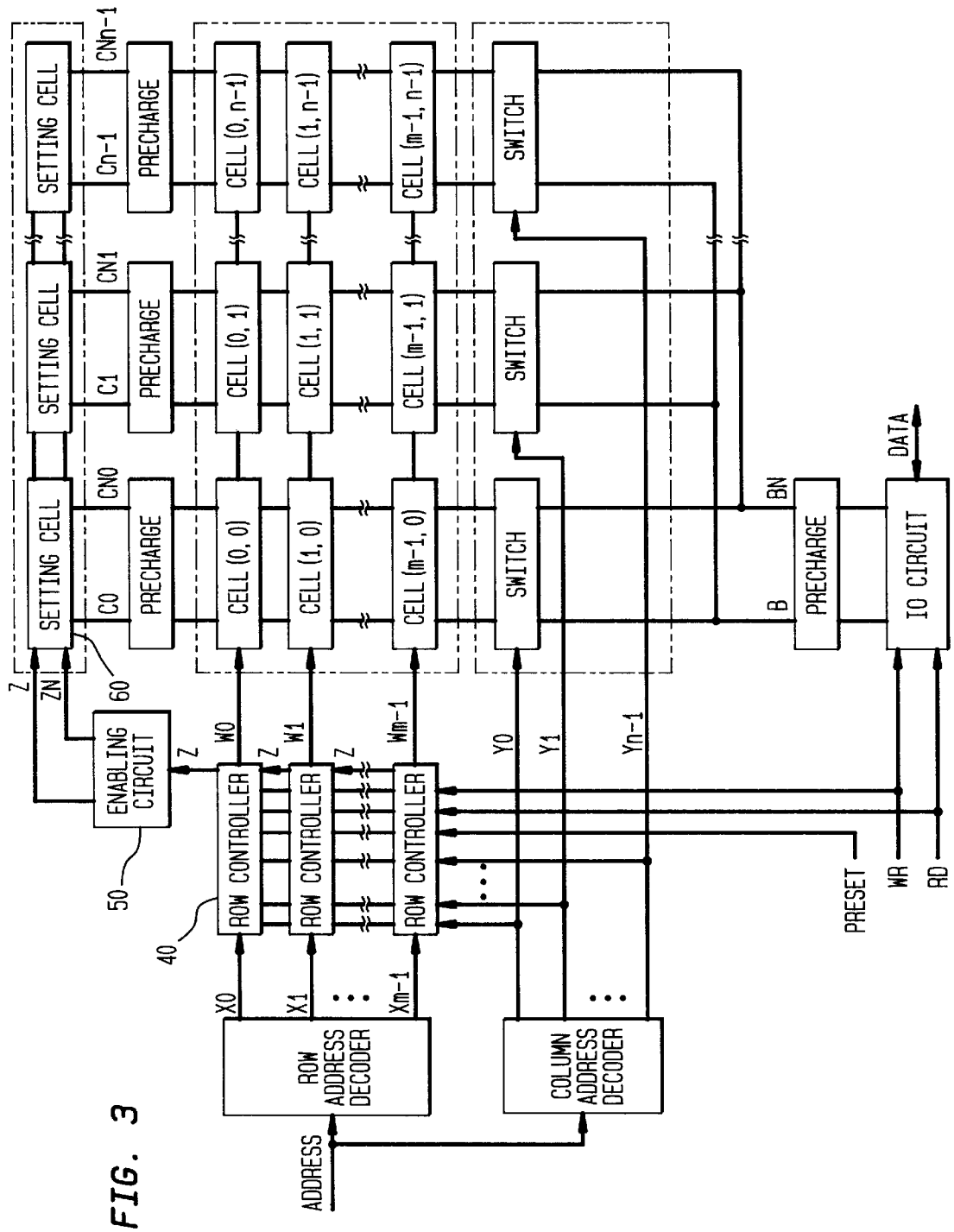
FIG. 3 shows a first preferred embodiment, according to the present invention.

FIG. 3 shows a block diagram of a first preferred embodiment of the present invention, which is a modified version of the single bit block diagram of FIG. 2. The preferred embodiment of FIG. 3 includes a row controller (e.g., 40) associated with each of the address lines X0, X1, ..., Xm−1, a setting cell (e.g., 60) associated with each of the data line pairs C0, CN0; C1, CN1; ..., Cn−1, CNn−1; and an enabling circuit 50. The row controllers, enabling circuit, and setting cells are used to implement the inventive presetting technique, as described below.

Figure 4A:
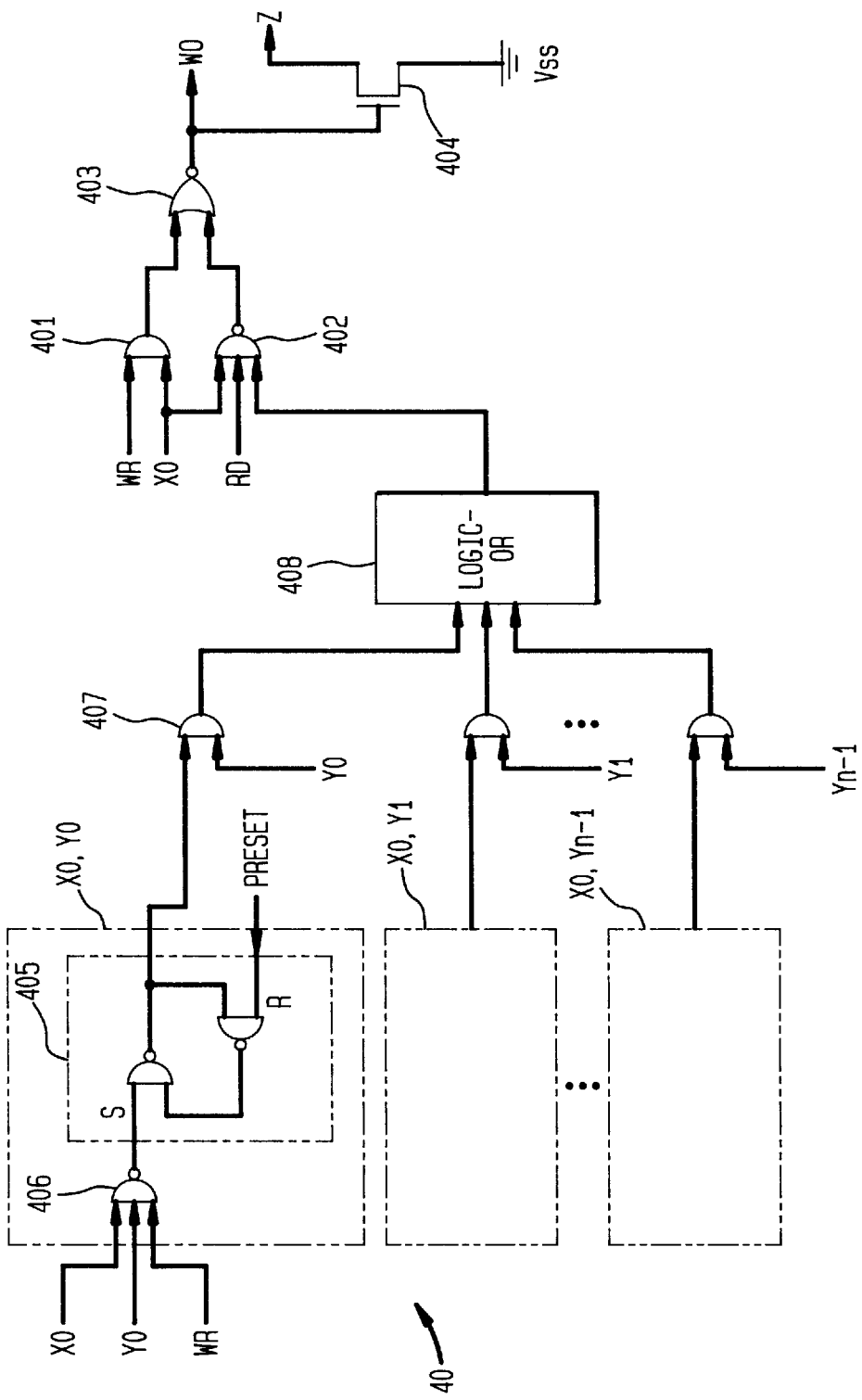
FIGS. 4A, 4B, 4C show respective circuits of the row controller, the enabling circuit, and the setting cell of FIG. 3.

The detailed operation of row controller 40 (first row address line X0 in FIG. 3) is depicted in FIG. 4A. Within row controller 40, there are n storage cells (X0, Y0; X0, Y1; ..., X0, Yn−1), which correspond to the n memory cells (0,0; 0,1; ..., 0,n−1) of row address line X0 in FIG. 3. Referring again to FIG. 4A, each first row address line X0 storage cell (X0, Yj) comprises an RS latch 405 and a NAND gate 406. NAND gate 406 receives the three inputs X0, Yj, and WR (write control signal), and outputs the resultant logic signal to a set terminal S of RS latch 405. A reset terminal R of RS latch 405 is connected to a PRESET control line, so that RS latch 405 can be reset by a PRESET signal. Thus, a storage cell (X0, Yj) acts as a flag cell, to indicate whether or not the corresponding memory cell (0,j) in the SRAM array has been previously written. The resultant output of RS latch 405 is "ANDed" with its corresponding column address line (Y0), in AND gate 407. The output of AND gate 407 is then "ORed" with the equivalent ANDed outputs of the other storage cells in address line X0 by an n-input logic-OR circuit 408. The output of logic-OR circuit 408 is inputted to a combinational logic circuit comprised of AND gates 401 and 402, and OR gate 403. AND gate 401 receives the signals WR and X0, while AND gate 402 receives the signals X0, RD (read control signal), and the output of logic-OR circuit 408. The output signals of AND gates 401 and 402 are inputted to OR gate 403, whose output signal is designated W0. The combinational logic circuit (AND gates 401, 402 and OR gate 403) thereby determines whether to implement the assertion of X0 onto W0, or to force W0 to a deasserted state. That is, address line W0 is placed in the asserted state whenever a write control signal causes the corresponding address to be flagged, and the asserted state is maintained when any flagged address is read (contents of memory cells) as a result of a read control signal (RD).

Conversely, address line W0 is placed in the deasserted state (memory cells disconnected) when the corresponding address is not flagged by a write control signal.

Figure 4B:
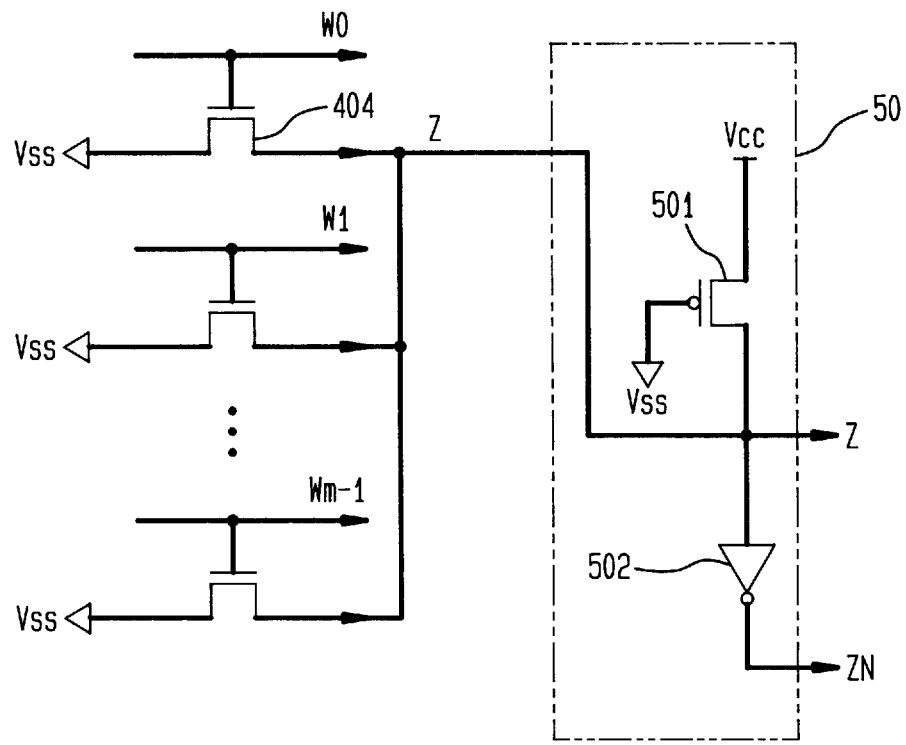

An NMOS 404 functions as a pull-down transistor between W0 and an output signal Z. As shown in FIG. 4B, NMOS 404, in parallel with the corresponding NMOS transistors of all m number of row controllers, forms a logic NOR circuit to a node Z, in conjunction with a single, common pull-up PMOS transistor 501, which functions as a weak resistor. As such, the presence of a write flag causes Z to be maintained at logic 0, while the absence of a write flag causes Z to change to a logic 1.

This logic NOR circuit configuration, where an NMOS is associated with each row line and shares the output line Z with all m number of row lines, does not require m input lines, in contrast to a conventional m input NOR gate. The use of a conventional m input NOR gate would complicate the regular routing of word lines, and would require a considerable amount of silicon area. Thus, the inventive NOR gate decimation provides reductions in both gate count and layout space requirements.

Figure 4C:
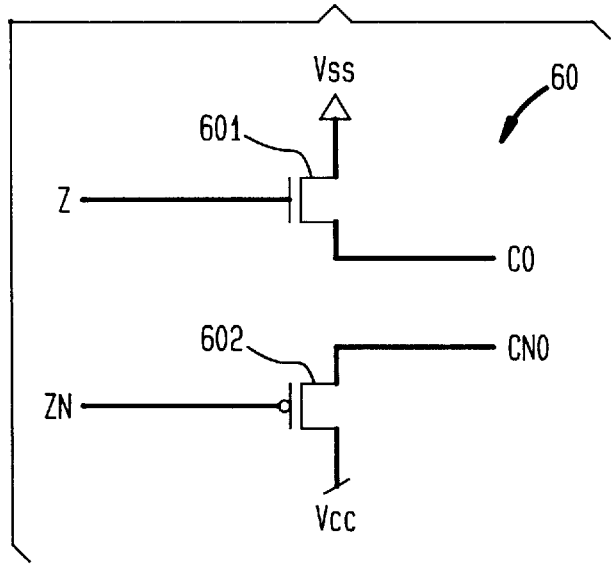
Figure 5:
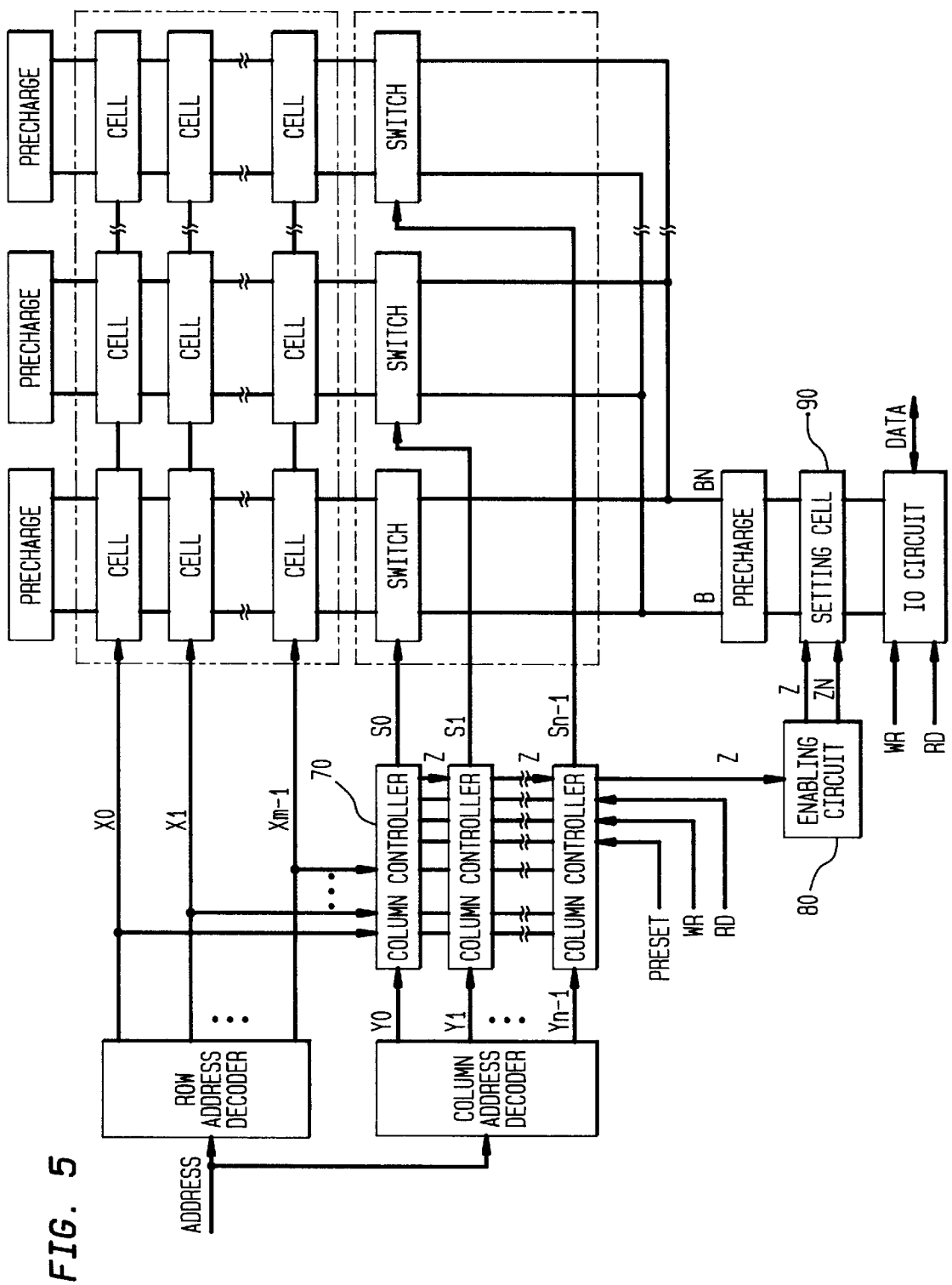
FIG. 5 shows a second preferred embodiment, according to the present invention.

Referring again to FIG. 4B, an enabling circuit 50 includes a PMOS 501 and an inverter 502. The drain of PMOS 501 is connected to the node Z and to the input of inverter 502, such that inverter 502 outputs the opposite logic state (ZN) of Z. As shown in FIG. 4C, output signals Z and ZN are connected to the gates of an N MOS 601 and a PMOS 602, respectively, with the drains of NMOS 601 and PMOS 602 connected to data lines C0 and CN0, respectively. In this configuration, NMOS 601 and PMOS 602 form a setting cell (e.g., 60), which places a preset logic value on the data lines C0 and CN0. That is, when Z=1 and ZN=0, C0=0 and CN0=1, representing a logic 0 on the data lines. Importantly, a reversal of the setting cell 60 drain connections to C0 and CN0 would place a preset value of logic 1 on data lines C0 and CN0.

Thus, in the absence of a write flag (deasserted state), the logic state of setting cell 60 would be outputted on data lines C0 and CN0, rather than the contents of the memory cells, at a subsequent read cycle.

Figure 6A:
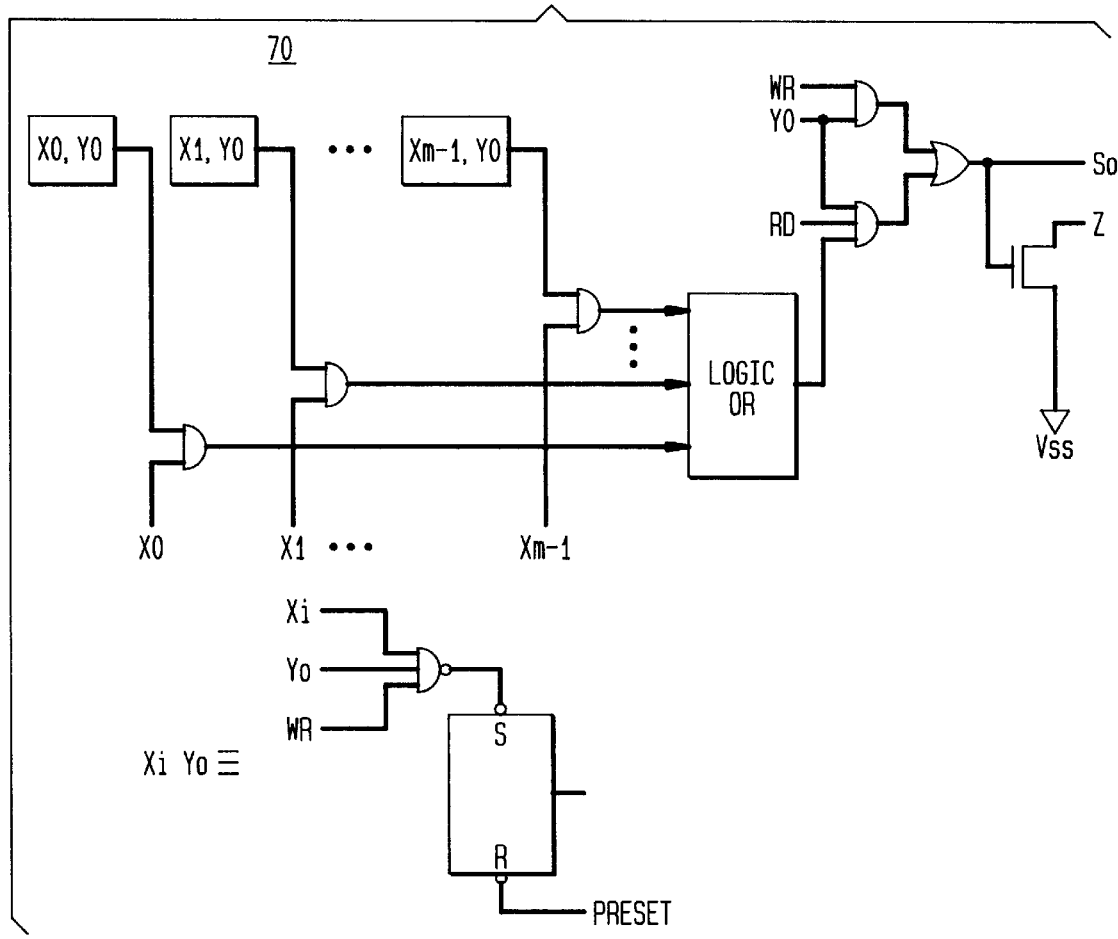
FIGS. 6A, 6B, 6C show respective circuits of the column controller, the enabling circuit, and the setting cell of FIG. 5.
Figure 6B:
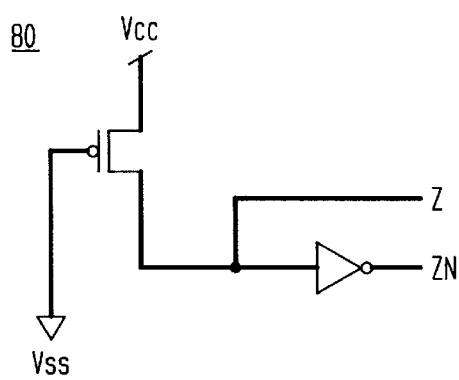
Figure 6C:
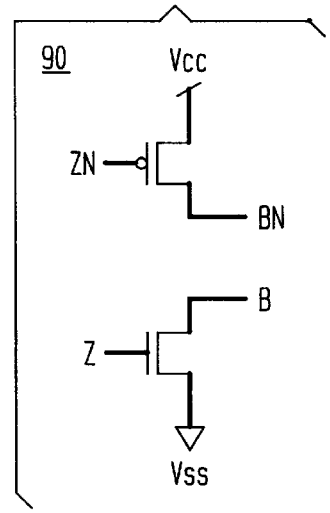
Figure 7:
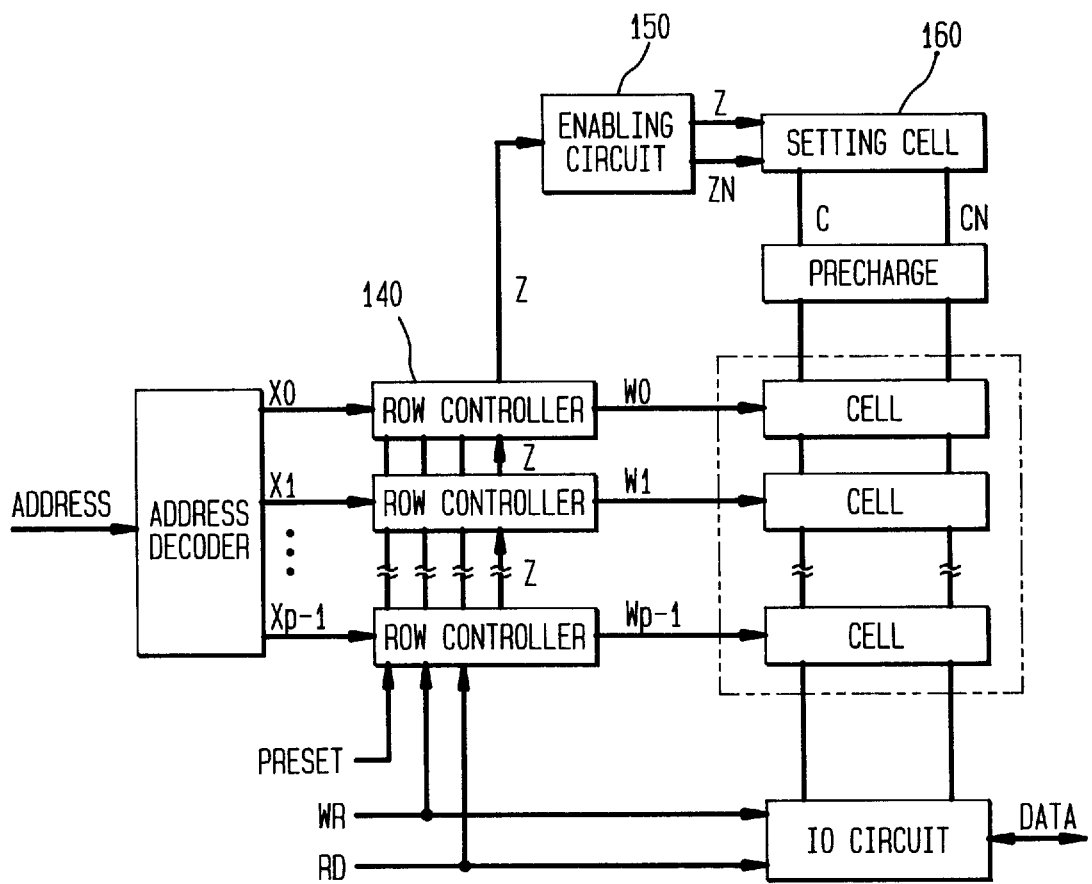
FIG. 7 shows a third preferred embodiment, according to the present invention.

FIGS. 5 and 6A–6C show a second preferred embodiment according to the present invention. This embodiment incorporates a column controller for each column address line, instead of the row controllers for the row address lines of FIG. 3. The detail of the column controller (e.g., 70) is shown in FIG. 6A. The column controller 70 configuration is very similar to that of the row controller 40 shown in FIG. 4A, except that the positions of the row address lines and the column address lines are exchanged. The details of the enabling circuit 80 and the setting cell 90, as shown in FIGS. 6B and 6C, respectively, are identical to those of enabling circuit 50 and setting cell 60 in FIGS. 4B and 4C, respectively. FIG. 6C shows setting cell 90 as a logic 0 cell. By exchanging the setting cell 90 drain connections to B aind BN, setting cell 90 becomes a logic 1 cell. A minor difference between the first embodiment (FIG. 3) and the second embodiment (FIG. 5) is that setting cell 90 (FIG. 5) is incorporated into the bit lines B, BN instead of into the data lines Cj, CNj (FIG. 3), thereby requiring only one setting cell for each single bit of the array.

Figure 8A:
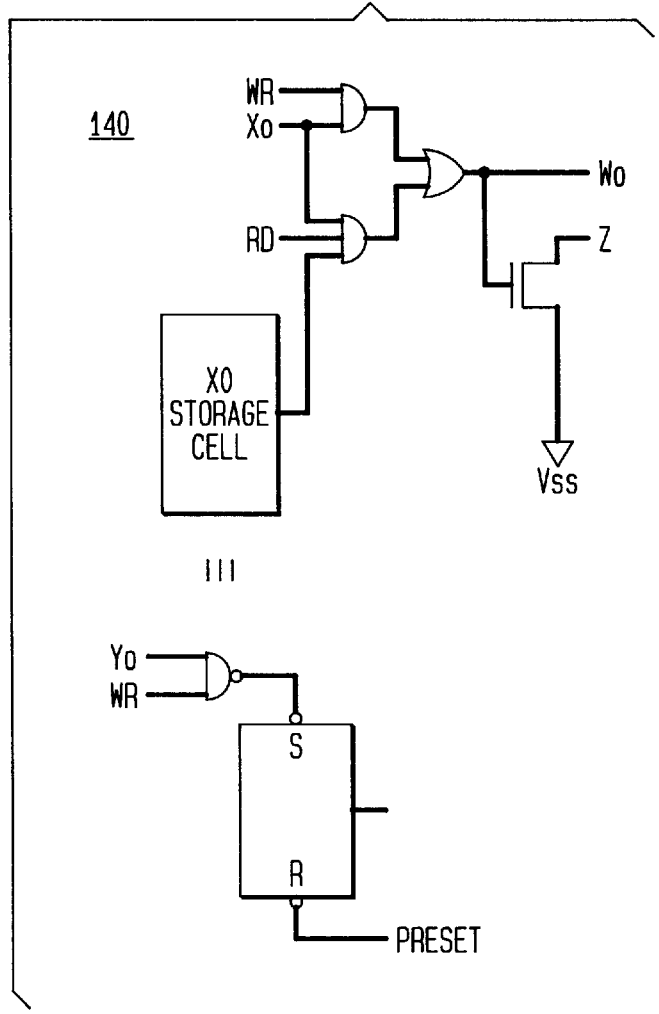
FIGS. 8A, 8B, 8C show respective circuits of the row controller, the enabling circuit, and the setting cell of FIG. 7.
Figure 8B:
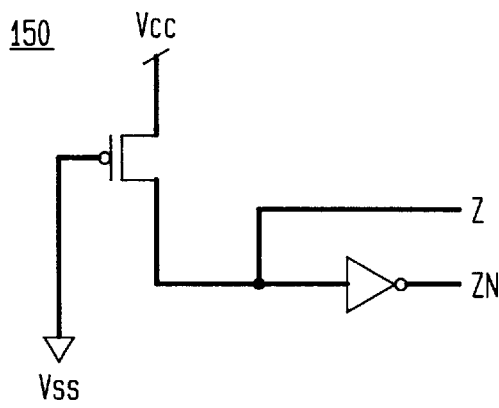
Figure 8C:
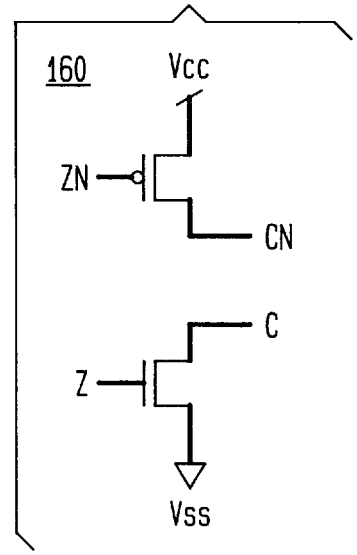

FIGS. 7 and 8A–8C show a third embodiment, for a row controller configuration as in FIG. 3, but with only one column per single bit (i.e., n=1). Row controller 140 is shown in FIG. 8A, where storage cell X0 has only two inputs, X0 and WR, for setting the RS latch. Storage cell X0 also receives a Preset input for clearing the RS latch. Enabling circuit 150 is shown in FIG. 8B, and setting cell 160 is shown in FIG. 8C.

Figure 9:
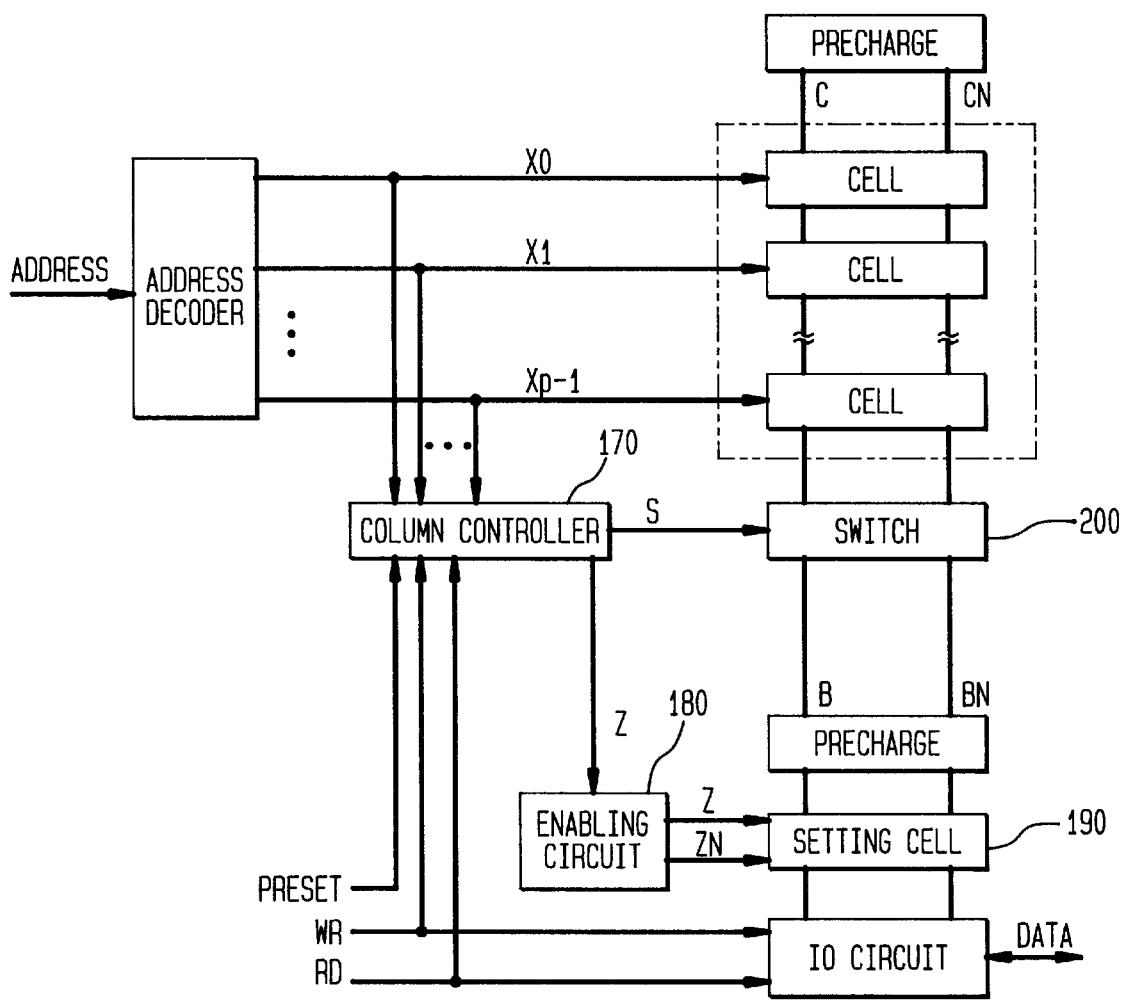
FIG. 9 shows a fourth preferred embodiment, according to the present invention.
Figure 10A:
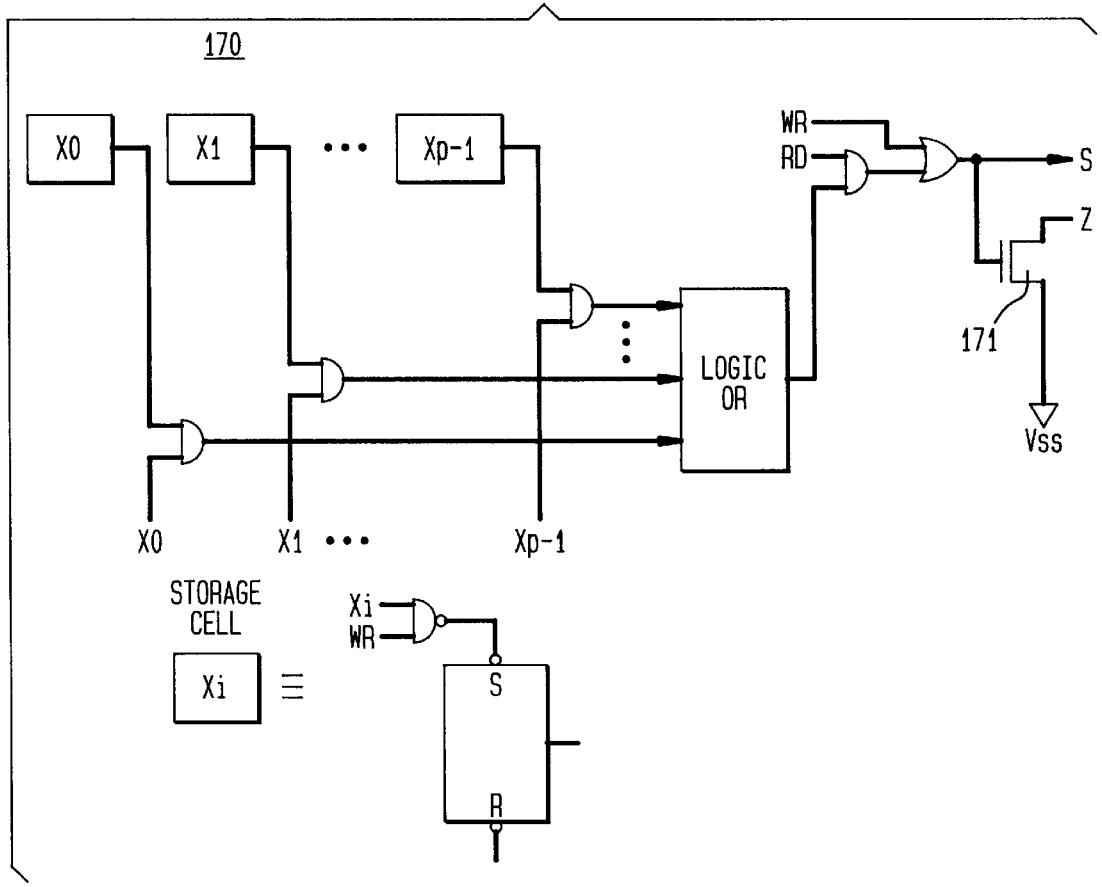
FIGS. 10A, 10B, 10C show respective circuits of the column controller, the enabling circuit, and the setting cell of FIG. 9.
Figure 10B:
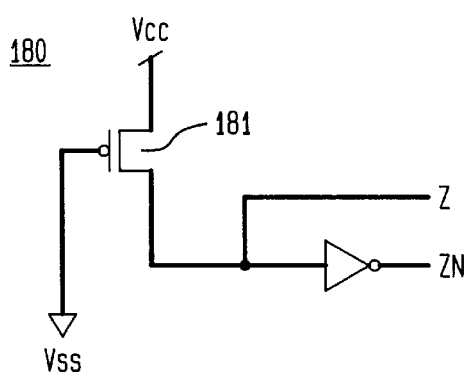
Figure 10C:
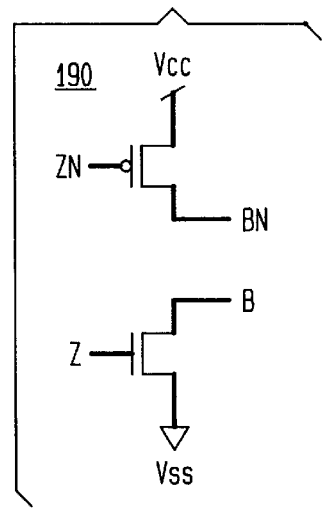

FIGS. 9 and 10A–C show a fourth embodiment, for a single column configuration similar to that of the third embodiment, except that a column controller is used instead of the row controllers. Referring to FIG. 9, a switch 200 is also included, to provide the necessary on/off control of the array column. FIG. 10A shows the configuration of column controller 170, and FIGS. 10B and 10C show the enabling circuit 180 and the setting cell 190, respectively. The weak pull-up PMOS 181 of enabling circuit 180 (FIG. 10B) and NMOS 171 (FIG. 10A) form an inverter. In this single column controller configuration, layout space is not a significant issue, so that these two transistors (181 and 171) can be used as an inverter, with an input S and an output Z.

In short, a SRAM configuration is disclosed which can output a preset state without an initial write to each cell in the SRAM. Moreover, the disclosed SRAM configuration can be preset with any combination of logic states.

The above described embodiments of the invention are intended to be illustrative only. Numerous alternative embodiments may be devised by those skilled in the art without departing from the spirit and scope of the following claims.

I claim:

1. A presettable static random access memory (SRAM), comprising:

an array of memory cells, arranged in m rows and n columns, each of said n columns having a corresponding set of data lines, a row address decoder, a number m of row controller circuits, responsive to said row address decoder, corresponding to said m rows of memory cells, for controlling access to said m corresponding rows of memory cells, a column address decoder, for switching the outputs of said corresponding sets of data lines to a common set of bit lines, and for outputting column address signals to said row controller circuits, an input output (IO) circuit connected between said bit lines and a data bus, for passing data from said data bus to said bit lines upon receipt of a write control signal, and for passing data from said bit lines to said data bus upon receipt of a read signal, an enabling circuit, for receiving an activating output signal from said row controller circuits, and for outputting an enabling signal when so activated, a number n of setting cell circuits, each of said setting cell circuits being connected to said data lines of a corresponding one of said n columns of memory cells, said n setting cell circuits for receiving said enabling signal, which enables each of said setting cell circuits to output a particular logic state value to said data lines of said corresponding column, wherein when any of said m row controller circuits senses a write signal on its corresponding row line of said memory cells, said row controller circuit maintains the asserted state of said corresponding row line of said memory cells, wherein a subsequent read cycle will cause the contents of said corresponding row line of said memory cells to be outputted on said data lines, and wherein when said m row controller circuits do not sense a write signal on any of their corresponding row lines of said memory cells, said row controller circuits force the deassertion of said corresponding row lines of said memory cells, and simultaneously cause said enabling circuit to output said enabling signal to said n setting cell circuits, wherein a subsequent read cycle will cause said n setting cell circuits to output a particular logic state on said data lines of said corresponding columns.

2. The presettable SRAM of claim 1 wherein each of said m row controller circuits comprises n storage cells, said n storage cells corresponding to said n memory cells in the corresponding row of said array of memory cells, wherein when any of said n memory cells in a row is written to by means of a write control signal, said corresponding storage cell is flagged by said write control signal, and said flagged storage cell causes said asserted state to be maintained on said corresponding row of said n memory cells, and wherein when none of said n memory cells in a row are written to, said corresponding storage cells will not be flagged by a write control signal, and said unflagged storage cells will force said deassertion of said corresponding row of said n memory cells.

3. The presettable SRAM of claim 1 wherein any of said n setting cell circuits may be configured to output a logic 0 to said corresponding set of data lines.

4. The presettable SRAM of claim 1 wherein any of said n setting cell circuits may be configured to output a logic 1 to said corresponding set of data lines.

5. The presettable SRAM of claim 1 wherein said enabling circuit forms a logic NOR circuit with the output circuits of said m row controller circuits, said output circuits being commonly connected at a node in order to input a single activating signal to said enabling circuit.

6. The presettable SRAM of claim 1 wherein each of said sets of data lines and bit lines incorporates a precharge cell for voltage level equalization.

7. A presettable static random access memory (SRAM), comprising:

an array of memory cells, arranged in m rows and n columns, each of said n columns having a corresponding set of data lines, a column address decoder, a number n of column controller circuits, responsive to said column address decoder, corresponding to said n columns of memory cells, for controlling access to said corresponding columns of memory cells, and for switching the outputs of said corresponding sets of data lines to a common set of bit lines, a row address decoder, for accessing said m rows of memory cells, and for outputting row address signals to said column controller circuits, an input output (IO) circuit connected between said bit lines and a data bus, for passing data from said data bus to said bit lines upon receipt of a write control signal, and for passing data from said bit lines to said data bus upon receipt of a read signal, an enabling circuit, for receiving an activating output signal from said n column controller circuits, and for outputting an enabling signal when so activated, a single setting cell circuit connected to said bit lines, said setting cell circuit for receiving said enabling signal, which enables said setting cell circuit to output a particular logic state value to said bit lines, wherein when any of said n column controller circuits senses a write signal on its corresponding column line of said memory cells, said column controller circuit maintains the asserted state of said corresponding column line of said memory cells, wherein a subsequent read cycle will cause the contents of said corresponding column line of said memory cells to be outputted on said bit lines, and wherein when said n column controller circuits do not sense a write signal on any of their corresponding column lines of said memory cells, said column controller circuits force the deassertion of said corresponding column lines of said memory cells, and simultaneously cause said enabling circuit to output said enabling signal to said setting cell circuit, wherein a subsequent read cycle will cause said setting cell circuit to output a particular logic state on said bit lines.

8. The presettable SRAM of claim 7 wherein each of said n column controller circuits comprises m storage cells, said m storage cells corresponding to said m memory cells in the corresponding column of said array of memory cells, wherein when any of said m memory cells in a column is written to by means of a write control signal, said corresponding storage cell is flagged by said write control signal, and said flagged storage cell causes said asserted state to be maintained on said corresponding column of said m memory cells, and wherein when none of said m memory cells in a column are written to, said corresponding storage cells will not be flagged by a write control signal, and said unflagged storage cells will force said deassertion of said corresponding column of said m memory cells.

9. The presettable SRAM of claim 7 wherein said setting cell circuit may be configured to output a logic 0 to said bit lines.

10. The presettable SRAM of claim 7 wherein said setting cell circuit may be configured to output a logic 1 to said bit lines.

11. The presettable SRAM of claim 7 wherein said enabling circuit forms a logic NOR circuit with the output circuits of said n column controller circuits, said output circuits being commonly connected at a node in order to input a single activating signal to said enabling circuit.

12. The presettable SRAM of claim 7 wherein each of said sets of data lines and bit lines incorporates a precharge cell for voltage level equalization.

13. A presettable static random access memory (SRAM), comprising:

an array of memory cells, arranged in p rows and one column, said column having a corresponding set of data lines, an address decoder, a number p of row controller circuits, responsive to said address decoder, corresponding to said p rows of memory cells, for controlling access to said p corresponding rows of memory cells, an input output (IO) circuit connected between said data lines and a data bus, for passing data from said data bus to said data lines upon receipt of a write control signal, and for passing data from said data lines to said data bus upon receipt of a read signal, an enabling circuit, for receiving an activating output signal from said p row controller circuits, and for outputting an enabling signal when so activated, a setting cell circuit connected to said data lines, said setting cell circuit for receiving said enabling signal, which enables said setting cell circuit to output a particular logic state value to said data lines, wherein when any of said p row controller circuits senses a write signal on its corresponding row line of said memory cells, said row controller circuit maintains the asserted state of said corresponding row line of said memory cells, wherein a subsequent read cycle will cause the contents of said corresponding row line of said memory cells to be outputted on said data lines, and wherein when said p row controller circuits do not sense a write signal on any of their corresponding row lines of said memory cells, said row controller circuits force the deassertion of said corresponding row lines of said memory cells, and simultaneously cause said enabling circuit to output said enabling signal to said setting cell circuit, wherein a subsequent read cycle will cause said setting cell circuit to output a particular logic state on said data lines.

14. The presettable SRAM of claim 13 wherein each of said p row controller circuits comprises a storage cell, said storage cell corresponding to said memory cell in the corresponding row of said array of memory cells, wherein when said memory cell in a row is written to by means of a write control signal, said corresponding storage cell is flagged by said write control signal, and said flagged storage cell causes said asserted state to be maintained on said corresponding row of said memory cell, and wherein when said memory cell in a row is not written to, said corresponding storage cell will not be flagged by a write control signal, and said unflagged storage cell will force said deassertion of said corresponding row of said memory cell.

15. The presettable SRAM of claim 13 wherein said setting cell circuit may be configured to output a logic 0 to said data lines.

16. The presettable SRAM of claim 13 wherein said setting cell circuit may be configured to output a logic 1 to said data lines.

17. The presettable SRAM of claim 13 wherein said enabling circuit forms a logic NOR circuit with the output circuits of said p row controller circuits, said output circuits being commonly connected at a node in order to input a single activating signal to said enabling circuit.

18. The presettable SRAM of claim 13 wherein said set of data lines incorporates a precharge cell for voltage level equalization.

19. A presentable static random access memory (SRAM), comprising:

an array of memory cells, arranged in p rows and one column, said column having a corresponding set of data lines, an address decoder, a column controller circuit, responsive to said address decoder, for controlling access to said column of p memory cells, and for switching the outputs of said set of data lines to a set of bit lines, an input output (IO) circuit connected between said bit lines and a data bus, for passing data from said data bus to said bit lines upon receipt of a write control signal, and for passing data from said bit lines to said data bus upon receipt of a read signal, an enabling circuit, for receiving an activating output signal from said column controller circuit, and for outputting an enabling signal when so activated, a setting cell circuit connected to said bit lines, said setting cell circuit for receiving said enabling signal, which enables said setting cell circuit to output a particular logic state value to said bit lines, wherein when said column controller circuit senses a write signal on said column line of said memory cells, said column controller circuit maintains the asserted state of said column line, wherein a subsequent read cycle will cause the contents of said column line memory cells to be outputted on said bit lines, and wherein when said column controller circuit does not sense a write signal on said column line of said memory cells, said column controller circuit forces the deassertion of said column line, and simultaneously causes said enabling circuit to output said enabling signal to said setting cell circuit, wherein a subsequent read cycle will cause said setting cell circuit to output a particular logic state on said bit lines.

20. The presettable SRAM of claim 19 wherein said column controller circuit comprises p storage cells, said p storage cells corresponding to said p memory cells in said array of memory cells, wherein when any of said p memory cells are written to by means of a write control signal, said corresponding storage cell is flagged by said write control signal, and said flagged storage cell causes said asserted state to be maintained on said column of said p memory cells, and wherein when none of said memory cells are written to, said corresponding storage cells will not be flagged by a write control signal, and said unflagged storage cells will force said deassertion of said column of said p memory cells.

21. The presettable SRAM of claim 19 wherein said setting cell circuit may be configured to output a logic 0 to said bit lines.

22. The presettable SRAM of claim 19 wherein said setting cell circuit may be configured to output a logic 1 to said bit lines.

23. The presentable SRAM of claim 19 wherein each of said set of data lines and said set of bit lines incorporates a precharge cell for voltage level equalization.

24. A method of presetting a SRAM array without writing a preset value into each memory cell in said array, comprising the steps of:

presetting a desired output state in setting cells, sensing the occurrence of a write signal to said memory cells, setting a write flag to denote said occurrence of said write signal, if said write flag is set, outputting the contents of said memory cells at a subsequent read cycle, if said write flag is not set, outputting the contents of said setting cells at a subsequent read cycle.

* * * * *